United States Patent
Hayashi

(10) Patent No.: US 6,982,455 B2
(45) Date of Patent: Jan. 3, 2006

(54) SEMICONDUCTOR DEVICE AND METHOD OF MANUFACTURING THE SAME

(75) Inventor: Takahisa Hayashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/699,734

(22) Filed: Nov. 4, 2003

(65) Prior Publication Data

US 2004/0238865 A1 Dec. 2, 2004

(30) Foreign Application Priority Data

May 30, 2003 (JP) .................................... 2003-153693

(51) Int. Cl.
| | |
|---|---|
| H01L 27/108 | (2006.01) |
| H01L 29/76 | (2006.01) |
| H01L 29/94 | (2006.01) |
| H01L 31/119 | (2006.01) |

(52) U.S. Cl. .................. 257/310; 257/306; 257/296; 438/3; 438/244

(58) Field of Classification Search ............... 257/295, 257/296, 306, 310; 438/238, 244, 3
See application file for complete search history.

(56) References Cited

U.S. PATENT DOCUMENTS

| | | | | |
|---|---|---|---|---|
| 6,249,014 B1 | * | 6/2001 | Bailey | 257/295 |
| 6,365,927 B1 | * | 4/2002 | Cuchiaro et al. | 257/295 |
| 6,392,265 B2 | * | 5/2002 | Kondo et al. | 257/295 |
| 6,440,815 B1 | | 8/2002 | Mitsuhashi | |
| 6,521,927 B2 | | 2/2003 | Hidaka et al. | |
| 6,730,948 B2 | * | 5/2004 | Umeda et al. | 257/295 |

FOREIGN PATENT DOCUMENTS

| | | |
|---|---|---|
| JP | 9-121023 | 5/1997 |
| JP | 11-17124 | 1/1999 |
| JP | 2000-114489 | 4/2000 |
| JP | 2002-353414 | 12/2002 |
| JP | 2003-86776 | 3/2003 |

OTHER PUBLICATIONS

Tadashi Shiosaki et al., [ ] "Towards the pratical use of the FeRAM merged LSI"pp. 244–246 (Ferroelectric Advanced Process) with an English translation.

* cited by examiner

Primary Examiner—Nathan J. Flynn
Assistant Examiner—Victor A. Mandala, Jr.
(74) Attorney, Agent, or Firm—Wenderoth, Lind & Ponack, L.L.P.

(57) ABSTRACT

A semiconductor device has a ferroelectric capacitor. The semiconductor device includes an interlayer insulating layer, a ferroelectric capacitor and an insulating side wall film. The interlayer insulating layer is formed on a substrate including an integrated circuit and has a contact hole exposing a part of the integrated circuit. The ferroelectric capacitor is formed by depositing a first electrode layer, a ferroelectric layer and a second electrode layer on the interlayer insulating layer in this order. The insulating side wall film covers a peripheral edge section of the ferroelectric capacitor and is spaced from a peripheral edge section of the contact hole. A wiring layer electrically connects the second electrode layer to the integrated circuit through the contact hole.

7 Claims, 7 Drawing Sheets

MEMORY AREA | LOGIC AREA

MEMORY AREA | LOGIC AREA

SEMICONDUCTOR DEVICE AND METHOD OF MANUFACTURING THE SAME

BACKGROUND OF THE INVENTION

1. Field of the Invention

The present invention relates to a semiconductor device having a ferroelectric capacitor and a method of manufacturing such a device.

2. Description of the Related Art

A ferroelectric memory is known as a non-volatile semiconductor memory utilizing a polarization of its ferroelectric material exhibiting a hysteresis against an applied electric field. The ferroelectric memory has characteristics of a short operation time for writing and reading and a low driving voltage. By utilizing these characteristics, the ferroelectric memory can replace not only a prior non-volatile semiconductor memory such as EEPROM, but also a volatile semiconductor memory such as DRAM. Research on the ferroelectric memory has, therefore, been conducted.

The ferroelectric memory has a plurality of memory cells. The memory cell includes a ferroelectric capacitor (hereinafter referred to as capacitor) having a ferroelectric layer sandwiched by a lower electrode layer and an upper electrode layer.

The capacitor comprises a multilayer structure body including a lower electrode layer consisting of, for example, platinum (Pt), a ferroelectric layer consisting of a ferroelectric material such as lead zirconate titanate (PZT) and an upper electrode layer consisting of platinum (Pt) in this order. The above multilayer structure body is covered with a protective layer consisting of silicon dioxide (SiO2) formed by CVD and is protected. For example, refer to Japanese Patent Kokai No. 09-121023.

In a process for forming the protective layer, a hydride gas such as silane is utilized as a material of the protective layer. The hydride gas is decomposed to generate a hydrogen gas during formation of the protective layer. If the hydrogen gas diffuses into the ferroelectric layer, the ferroelectric layer is deteriorated by the reducing reaction. The deteriorated ferroelectric layer does not have satisfactory electrical properties. Thus, it is proposed to provide a protective layer to a capacitor as a hydrogen diffusion preventing layer consisting of tantalum oxide. For example, refer to Japanese Patent Kokai No. 2002-353414.

The memory cell comprises a capacitor electrically connected to a switch element such as a transistor.

The above memory cell including a capacitor is formed on a silicon substrate having a MOS type transistor thereon. The MOS type transistor is covered with an interlayer insulating film. The capacitor comprises a lower electrode layer, a ferroelectric layer and an upper electrode layer, which are formed in this order on the interlayer insulating film. The capacitor is covered with a protective layer. The protective layer is also provided on the interlayer insulating film outside a region where the capacitor is mounted.

A contact hole for the upper electrode layer of the capacitor is applied to the protective layer so as to expose the upper electrode layer. Further, a source/drain contact hole is formed so as to pass through the protective layer and the interlayer insulating film, and exposes a source/drain region of the MOS type transistor. A connection wiring electrically connects the upper electrode layer to the source/drain region through the contact hole for the upper electrode layer and the contact hole for the source/drain area, to electrically connect the capacitor to the MOS type transistor.

The ferroelectric memory including the memory cell such as the above construction can be used as a memory of a logic LSI because of its speed and low power driving. For example, refer to "TOWARD PRACTICAL APPLICATION OF A FeRAM HYBRID LSI", Advanced Process of a ferroelectric memory, ver. 1, pp. 244–246, published by Science Forum on Sep. 13, 1999.

A FeRAM hybrid LSI which mixedly mounts the ferroelectric memory (hereinafter referred to as hybrid LSI) has a memory area and a logic area. In the memory area, switch elements such as a MOS type transistor and capacitors connected to the switch element are formed. In the logic area, a logic circuit is formed from logic circuit elements such as a CMOS.

The memory area has the same construction as the above ferroelectric memory. The switch element and the capacitor are connected to each other through a contact hole formed in an interlayer insulating layer covering the switch element and a protect layer covering the capacitor.

A logic circuit element formed on a substrate and an interlayer insulating layer covering the logic circuit element are formed in the logic area. A protect layer covering the capacitor is formed on the interlayer insulating layer. A contact hole for the logic circuit element is formed so as to pass through the interlayer insulating layer and the protect layer, and exposes a source/drain area of the logic circuit element. A logic circuit wiring is formed to connect the logic circuit elements to each other through the contact hole for the logic circuit element.

SUMMARY OF THE INVENTION

According to the ferroelectric memory and the FeRAM hybrid LSI having the above construction, materials cannot be uniformly deposited in the contact hole, since an aspect ratio of the contact hole passing through the protect layer becomes larger by making a wiring width narrower. Accordingly, a connection wiring is deposited within the contact hole so that the electrical connection between the capacitor and the switch element is cut. When the protect layer has a function such as preventing hydrogen diffusion as a functional layer, a thickness of the protect layer become larger. Therefore, such disconnection is also produced.

A semiconductor device according to the invention includes an interlayer insulating layer formed on a substrate including an integrated circuit; a contact hole formed in the interlayer insulating layer; a ferroelectric capacitor formed by depositing a first electrode layer, a ferroelectric layer and a second electrode layer on the interlayer insulating layer in this order; and an insulating side wall film provided to a peripheral section of the ferroelectric capacitor and being spaced from a peripheral edge section of the contact hole. With respect to this semiconductor device, a wiring layer is formed through a contact hole formed in the interlayer insulating layer so that the second electrode layer of the ferroelectric capacitor and the integrated circuit are electrically connected to each other.

A method for manufacturing a semiconductor devices includes an interlayer insulating layer forming step for forming an interlayer insulating layer on a substrate including an integrated circuit; a contact hole forming step for forming a contact hole to expose a part of the integrated circuit through the interlayer insulating layer; a ferroelectric layer forming step for forming the ferroelectric capacitor by depositing a first electrode layer, a ferroelectric layer and a second electrode layer on the interlayer insulating layer in this order; a protective film forming step for forming a protective film consisting of an insulating material to cover the ferroelectric capacitor isotropically; a side wall film forming step for providing an insulating side wall film to a peripheral section of the ferroelectric capacitor by performing anisotropic etching to the protective film so as to be spaced from a peripheral edge section of the contact hole; and a wiring layer forming step for forming a wiring layer electrically connecting the second electrode layer of the ferroelectric capacitor to the integrated circuit through the contact hole formed in the interlayer insulating layer.

DETAILED DESCRIPTION OF THE EMBODIMENT

An embodiment of a semiconductor device according to the present invention will hereinafter be described in detail with reference to the accompanying drawings. It is noted that constituent elements having the about same functions and constitutions are denoted by the same reference symbols in the description given hereinafter and the drawings.

Figure 1:
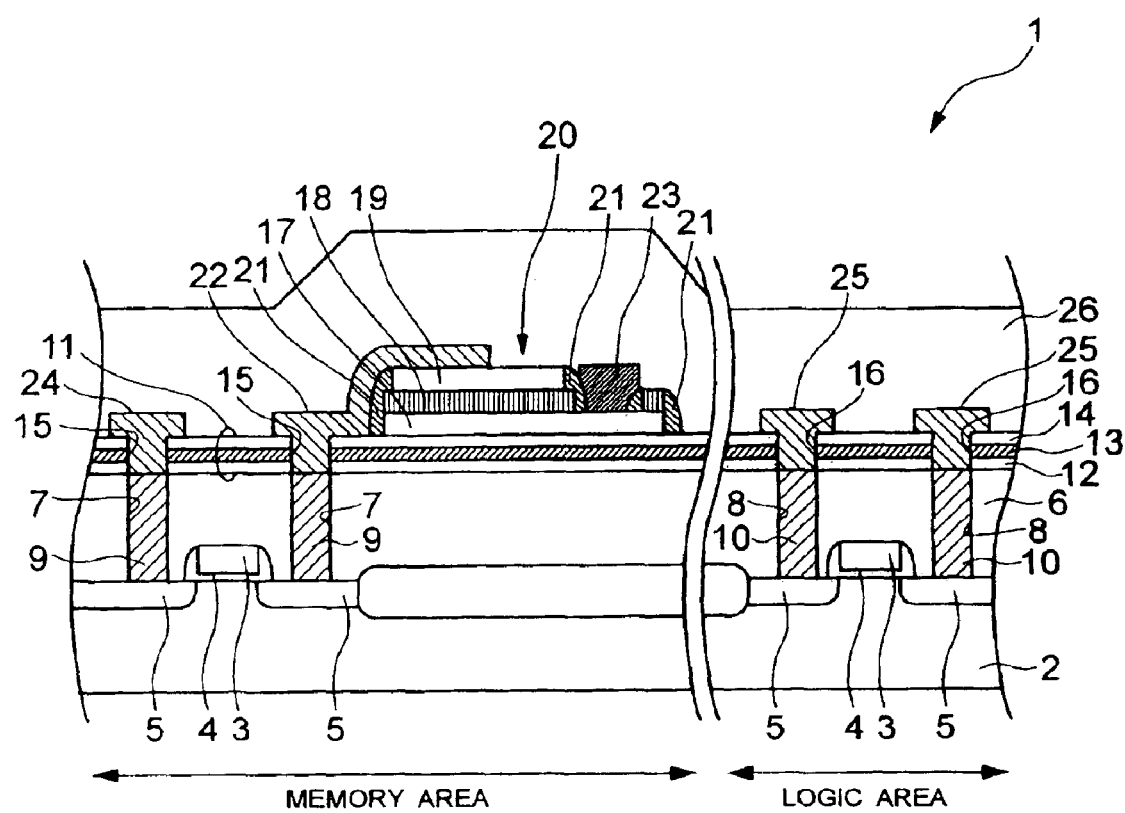
FIG. 1 is a partially enlarged sectional view of a semiconductor device according to the invention.

As shown in FIG. 1, a semiconductor device 1 according to the present invention includes a substrate 2 consisting of a semiconductor material such as silicon. An integrated circuit which includes a switch element, etc. is formed on a memory area of the substrate 2. Another integrated circuit which includes a logic circuit element, etc. is formed on a logic area of the substrate 2. The switch element and the logic circuit element are preferably a MOS transistor having a gate electrode 3, a gate insulation layer 4 and a source/drain region 5.

The switch element and the logic circuit element are covered with a first interlayer insulating layer 6. The first interlayer insulating layer 6 is preferably a silicon oxide film having a thickness of 1000 nm and a first contact hole 7 is formed through the first interlayer insulating layer 6 to expose the source/drain region 5 of the switch element. Further, a second contact hole 8 is formed to expose the source/drain region 5 of the logic circuit element. A first contact plug 9 consisting of a conductive material such as tungsten (W) is provided in the first contact hole 7. A second contact plug 10 consisting of a conductive material is provided in the second contact hole 8. The first contact plug 9 and second contact plug 10 are electrically connected to the source/drain regions 5, respectively.

A plug antioxidizing film 11, which has a property of preventing oxygen gas from passing through the film, is formed on the interlayer insulating layer 6. For example, the plug antioxidizing film 11 is a multilayer structure body comprising a first silicon oxide film 12, a silicon nitride film 13 and a second silicon oxide film 14. The plug antioxidizing film 11 is a layer for preventing the contact plug from being oxidized during a heat-treatment in an oxygen atmosphere performed in a manufacture of a semiconductor device. By sandwiching the silicon nitride film between silicon oxide films, an adhesive quality between the plug antioxidizing film and a structure body mounted on the plug antioxidizing film is improved. Thus, the plug antioxidizing film can be prevented from peeling from the structure body.

A third contact hole 15 to expose the first contact plug 9 in the memory area and a fourth contact hole 16 to expose the second contact plug 10 in the logic area are formed in the plug antioxidizing film 11.

A lower electrode layer 17 is formed on the plug antioxidizing film 11 of the memory area, as a first electrode layer. The lower electrode layer 17 consists of a conductive material. For example, the lower electrode layer may be a platinum (Pt) film having a thickness of 150 nm.

A ferroelectric layer 18 consisting of a ferroelectric material is formed on the lower electrode layer 17. For example, the ferroelectric layer 18 consists of a bismuth strontium tantalate (SrBi2Ta2O9, hereinafter referred to as 'SBT') film having a thickness of 150 nm. An end portion of the ferroelectric layer 18 forms a step-like portion on the lower electrode layer 17.

An upper electrode layer 19 is formed on the ferroelectric layer 18 as a second electrode. For example, the upper electrode layer 19 is a platinum (Pt) film having a thickness of 150 nm. An end portion of the upper electrode layer 19 forms a step-like portion on the ferroelectric layer 18.

A capacitor 20 comprises a multilayer structure body comprising such lower electrode layer 17, ferroelectric layer 18 and upper electrode layer 19.

An insulating side wall film 21 covers a peripheral section of the capacitor 20 other than a peripheral edge section of the first contact hole 7, the second contact hole 8, the third contact hole 15 and the fourth contact hole 16. That is, the insulating side wall film 21 is spaced from a peripheral edge section of the contact hole. The side wall film 21 covers each side surface of the lower electrode layer 17, the ferroelectric layer 18 and the upper electrode layer 19. Further, the side wall film 21 may expose a part of the lower electrode layer 17.

For example, the side wall film 21 may be a multilayer structure body including a hydrogen diffusion preventing layer (not shown) having a function of preventing diffusion of hydrogen gas and a metal oxide layer (not shown) consisting of silicon oxide. For example, the side wall film 21 may be comprised of the layers alternating by the hydrogen diffusion preventing layer covering the side portion of the capacitor and the metal oxide layer.

A connection wiring 22 formed through the contact hole 15 is extended over the side wall film 21 and electrically connects to either the upper electrode layer 19 or one of the first contact plugs 9. A connection wiring 22 consists of a conductive material such as aluminum (Al). A line width of the connection wiring is preferably less than 0.5 $\mu$m. A plate line 23 consisting of a conductive material, such as Al, electrically connects to some part of the lower electrode 17 not being covered with the side wall film 21. A bit line 24 electrically connected to another one of the first contact plugs 9 consists of a conductive material such as Al. The gate electrode 3 of the MOS transistor is a word line to connect to the capacitor 20 in the memory area. As above described, the ferroelectric memory is obtained by electrically connecting transistors to capacitors.

A logic area has a logic circuit wiring 25 electrically connected to the second contact plug 10 through the fourth contact hole 16. The logic circuit wiring 25 configures the logic circuit.

The memory area and logic area having the above wirings are covered with a second interlayer insulating layer 26 consisting of an insulating material such as silicon oxide.

According to the ferroelectric memory having the above construction, the depth of the contact hole can be small, since a side wall film covering a peripheral edge section of the capacitor is not formed on a peripheral edge section of the contact hole. Accordingly, it is hard to produce a disconnection in a connection wiring even if a wiring width is small. In other words, the ferroelectric memory may have a small wiring width, even if a thickness of the side wall film becomes large, by including a function layer having a function such as preventing hydrogen from diffusing.

The protective layer is not formed to the logic area in the semiconductor device. It is hard to produce a disconnection in the logic circuit, since the logic circuit is not required to be formed through the protective layer.

As a modified embodiment, the connection between the contact plug and the connection wiring may be provided without going through the contact hole formed in the plug antioxidizing film.

Figure 2:
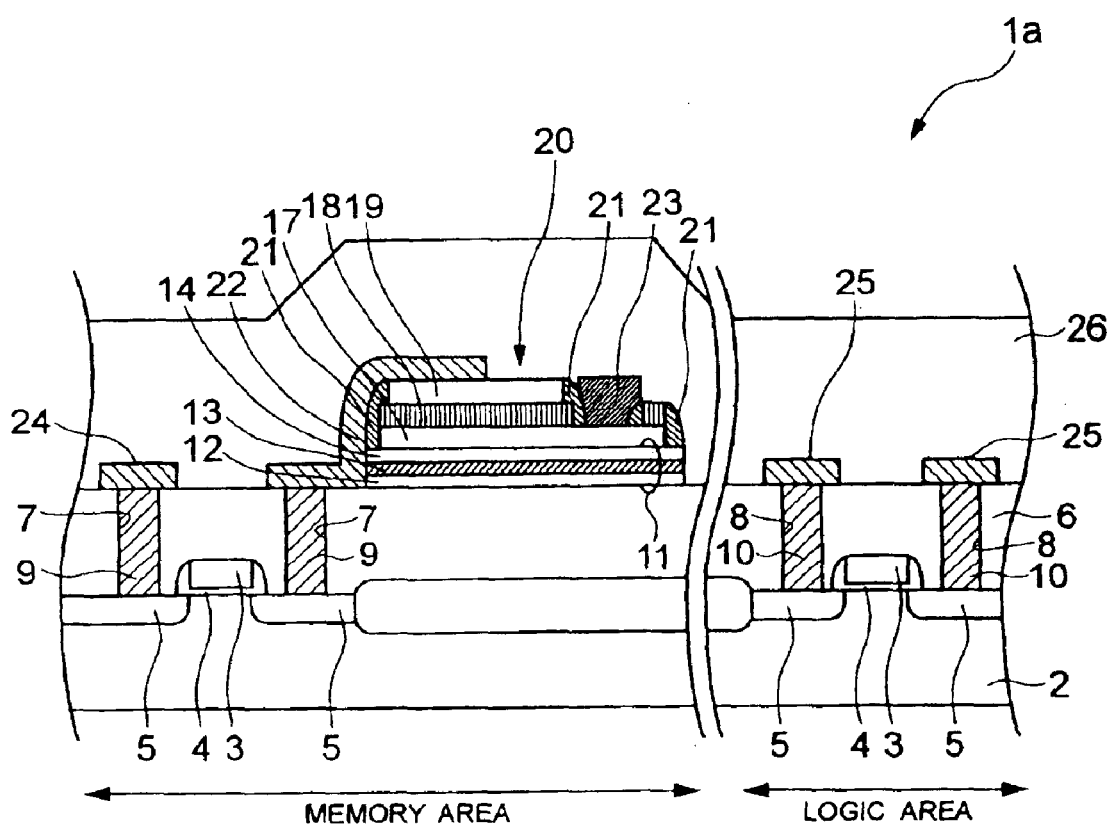
FIG. 2 is a partially enlarged sectional view of a modified embodiment of a semiconductor device according to the invention.

For example, as shown in FIG. 2, the semiconductor device 1a is formed to only a portion on which the plug antioxidizing film 11 supports the capacitor 20 and the first contact plug 9 and the second contact plug 10 may be exposed without the contact hole in the plug antioxidizing film 11. Except for the above, the modified embodiment is the same as the semiconductor device 1 shown in FIG. 1.

With respect to the ferroelectric memory having the above construction, a wiring width can be smaller in the semiconductor device, since neither the ferroelectric memory nor the logic circuit is required to be wired through the contact hole.

An area where the upper electrode layer is contacted to the connection wiring should be larger to improve adhesiveness between the upper electrode layer and the connection wiring. It is, therefor, desirable to widely expose a principal surface of the upper electrode layer. For example, a side surface of the upper electrode layer is covered with the side wall film and the side wall film does not exist on the principal surface of the upper electrode layer preferably.

Figure 3A:
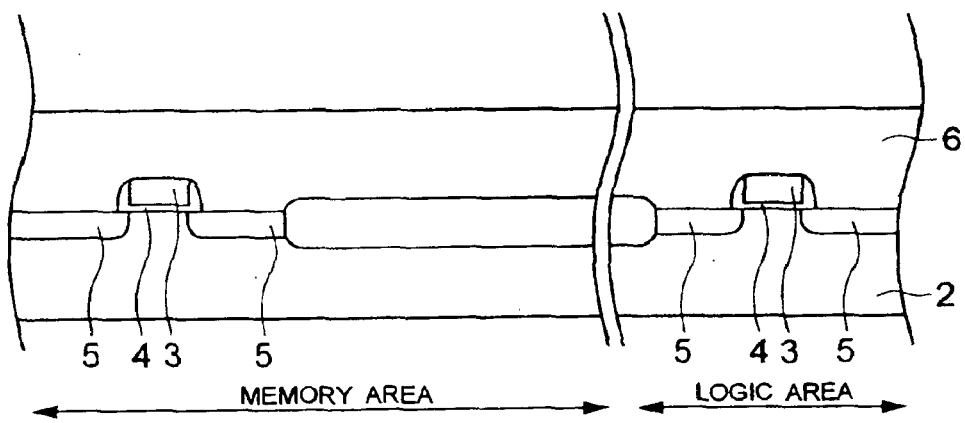
FIGS. 3A to 3C are partially enlarged sectional views in a manufacturing process of a semiconductor device according to the invention.

A fabrication method of the above capacitor is described below. As shown in FIG. 3A, a first interlayer insulating layer 6 is formed on a silicon substrate 2 in which MOS transistors having a gate electrode layer 3, a gate insulation layer 4 and a source/drain region 5 are formed on a memory area and a logic area.

Figure 3B:
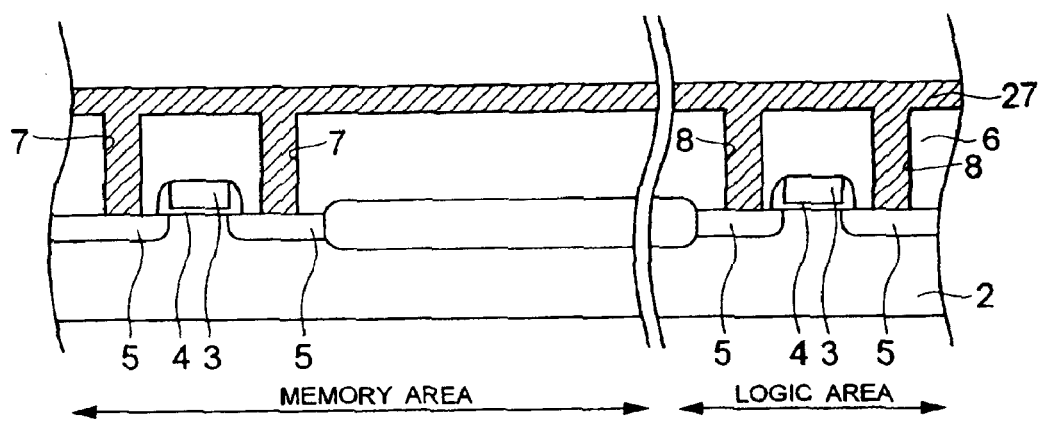

After a step for forming the interlayer insulating layer 6, as shown in FIG. 3B, etching processing such as a photolithography method is applied to the memory area and the logic area. Thus, a first contact hole 7 exposing the source/drain region 5 in the memory area and a second contact hole 8 exposing the source/drain region 5 in the logic area are formed. In the first contact hole 7 and the second contact hole 8, a tungsten film 27 fills the contact holes and covers the first interlayer insulating layer 6 by using coating forming method such as CVD.

Figure 3C:
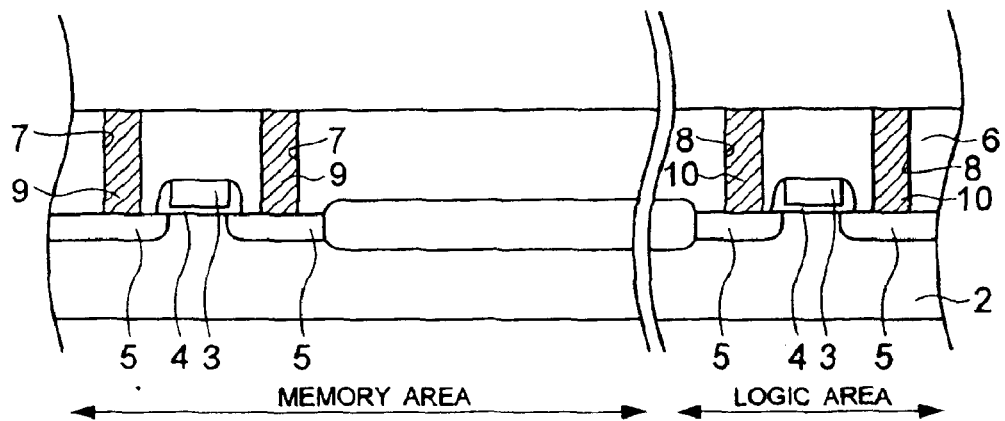

An etch-back process by dry etching method is performed on the tungsten film 27. As shown in FIG. 3C, the first contact plug 9 and the second plug 10 are formed so that the first contact hole 7 and the second contact hole 8 are buried, respectively.

Figure 4A:
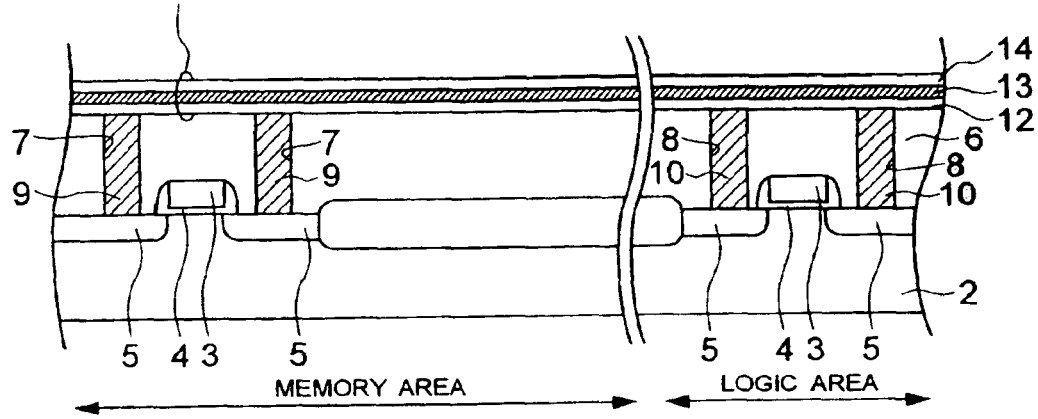
FIGS. 4A to 4C are partially enlarged sectional views continued from FIGS. 3A to 3C in a manufacturing process of a semiconductor device according to the invention.

As shown in FIG. 4A, a plug antioxidizing film 11 is formed on the substrate 2 on which the first contact plug 9 and the second contact plug 10 are formed. The plug antioxidizing film 11 can be deposited by using a coating forming method such as CVD. For example the plug antioxidizing film 11 is obtained by depositing a first silicon oxide film 12 having a thickness of 100 nm, a silicon nitride film 13 having a thickness of 100 nm and a second silicon oxide film 14 having a thickness of 200 nm in this order. The silicon nitride film 13 can prevent the oxidation of the conductive materials used in the first and second contact plugs during a heat-treatment in an oxygen atmosphere.

Figure 4B:
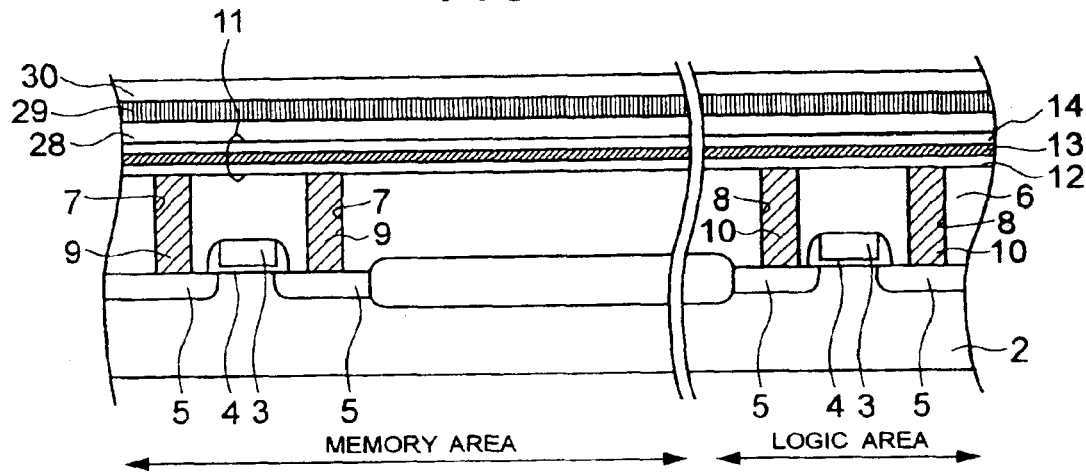

As shown in FIG. 4B, a lower electrode layer 28 is formed on the plug antioxidizing film 11. For example, the lower electrode layer 28 consists of Pt film having a thickness of 150 nm and is formed by using, for example, a sputtering method. After forming the lower electrode layer, a SBT precursor solution including strontium (Sr), bismuth (Bi) and tantalum (Ta) is deposited as a ferroelectric film 29 on the lower electrode layer by the spin coating method or other coating method. The ferroelectric film 29 is subjected to a heat treatment under 750° and 5 hours in an oxygen atmosphere. After the heat treatment, an upper electrode layer 30 consisting of Pt and having a thickness of 150 nm is formed by a sputtering method.

Figure 4C:
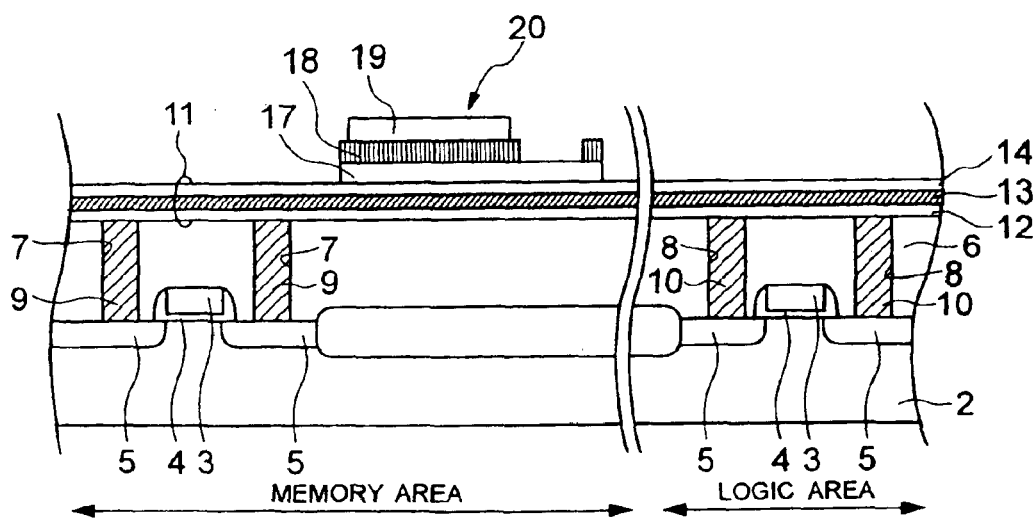

The lower electrode layer 28, the ferroelectric film 29 and the upper electrode layer 30 are processed by using a known photolithography technique and a known dry etching method using a photoresist and then a capacitor 20 is obtained as shown in FIG. 4C.

Figure 5A:
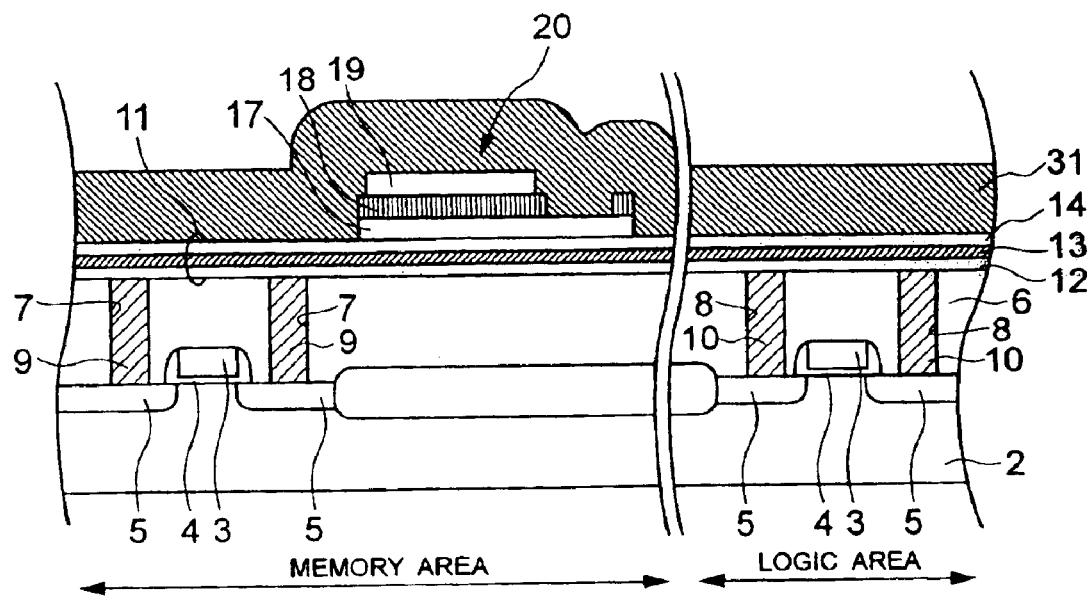
FIGS. 5A and 5B are partially enlarged sectional views continued from FIGS. 4A to 4c in a manufacturing process of a semiconductor device according to the invention.

After a capacitor 20 is formed, as shown in FIG. 5A, a protective film 31 covering the capacitor 20 and having isotropically the same thickness is formed by using a coating forming method such as a sputter method and a CVD method. The protective film 31 is formed as a hydrogen diffusion preventing layer consisting of tantalum oxide and a silicon oxide film in this order.

Figure 5B:
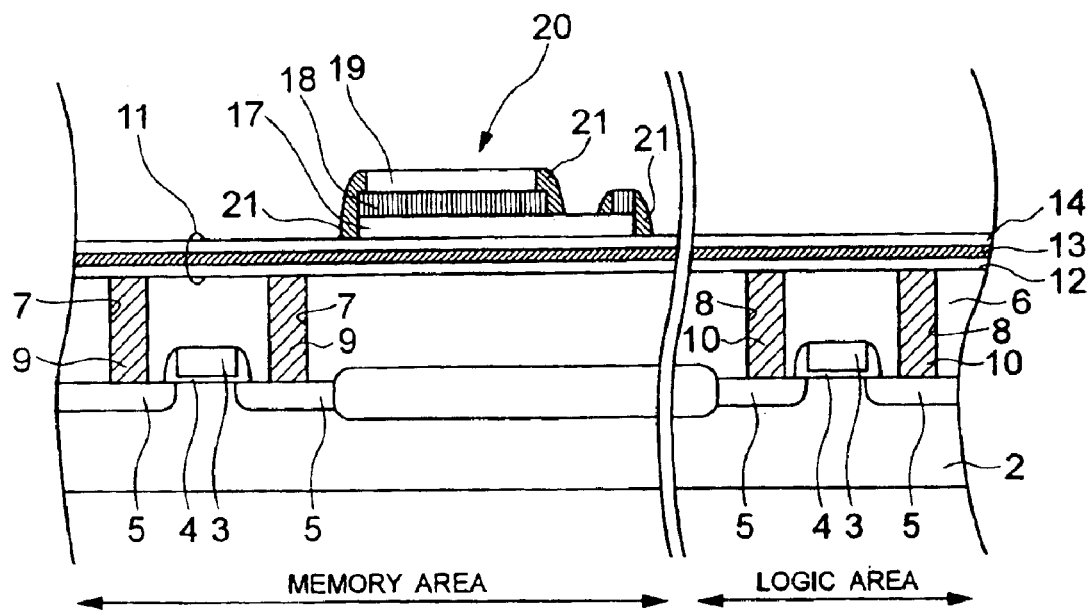

The protective film 31 is etched by an anisotropic etching method such as ion milling. As shown in FIG. 5B, an insulating side wall film 21 covering a peripheral edge section of the ferroelectric capacitor 20 is formed by the above etching treatment. By the above etching treatment, the upper electrode layer is exposed. It is desirable to widely expose the upper electrode layer.

Preferably, the side wall film does not exist on the principal surface of the upper electrode layer. After forming the side wall film, a heat treatment in an oxygen atmosphere may be performed, for example, the heat treatment at 750° for 1 hour. The electrical property of the ferroelectric layer is recovered to original condition, since a damage which is accumulated in the ferroelectric layer until the side wall film forming step is removed by such the heat treatment.

Figure 6A:
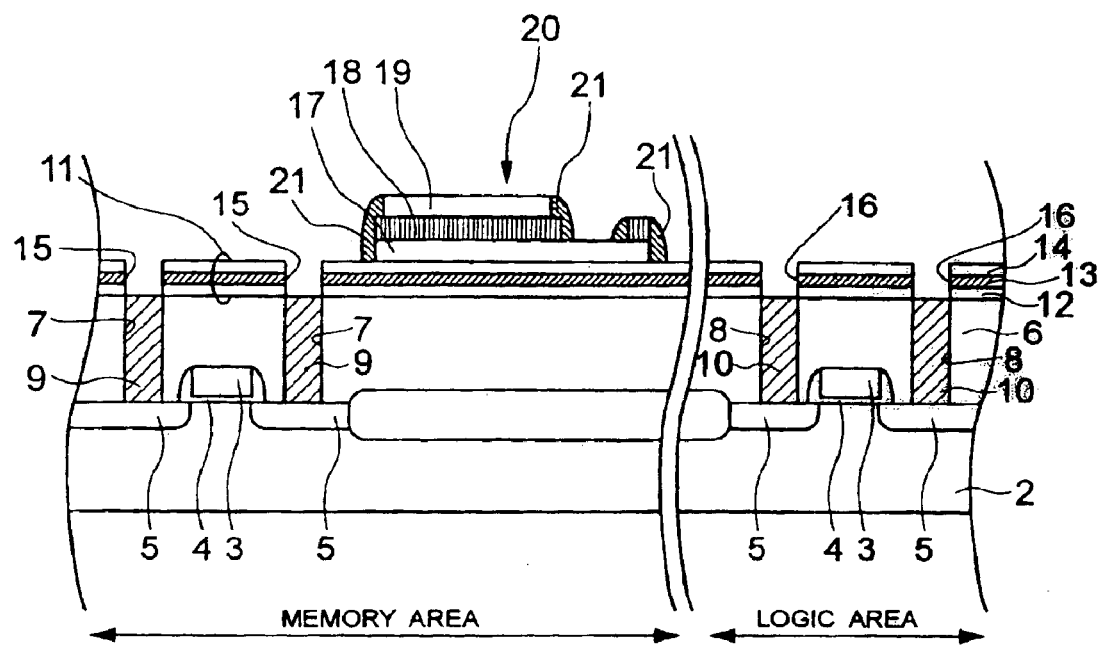
FIGS. 6A and 6B are partially enlarged sectional views continued from FIGS. 5A and 5B in a manufacturing process of a semiconductor device according to the invention.

After forming the side wall film, as shown in FIG. 6A, a third contact hole 15 to expose the first contact plug 9 is formed in the plug antioxidizing film on the memory area by a dry etching method using a mask such as a photoresist film. Simultaneously, a fourth contact hole 16 to expose the second contact plug 10 is formed in the plug antioxidizing film on the logic area.

Figure 6B:
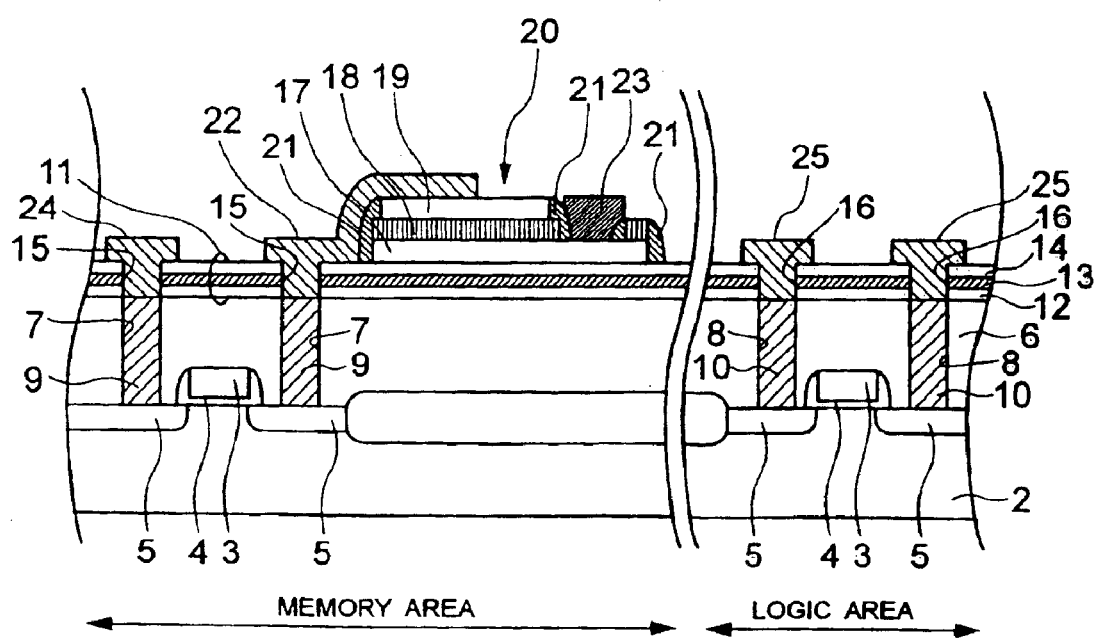

As shown in FIG. 6B, a connection wiring 22 is formed by the sputter method and extends from the side wall film and contacts either one of the first contact plugs 9 to the upper electrode layer through the third contact hole 15. Simultaneously, a ferroelectric memory is constituted by forming a plate line 23 connected to the lower electrode layer 17 and a bit line 24 connected to another one of the first contact plugs 9. Further, a logic circuit wiring 25 is formed so as to connect to the second contact plug 10 through the fourth contact hole 16 in the logic area.

The memory area and the logic area in which the above-described wirings are formed are covered with a second interlayer insulating layer consisting of silicon oxide, etc., and then the semiconductor device shown in FIG. 1 is obtained.

According to the above fabrication method, a side wall film covering only the side surface of the capacitor can be provided. Thus, a short circuit between the upper electrode layer and the lower electrode layer and deterioration of the ferroelectric layer can be prevented. Further, a disconnection does not occur even if a wiring width is small.

In the step for forming the side wall film, the second silicon oxide film may be removed. A depth of the second contact hole can be decreased by removing the second silicon oxide film. Further, the contact plug may be protected from the oxygen atmosphere during the heat treatment following the step for forming the side wall film.

Figure 7:
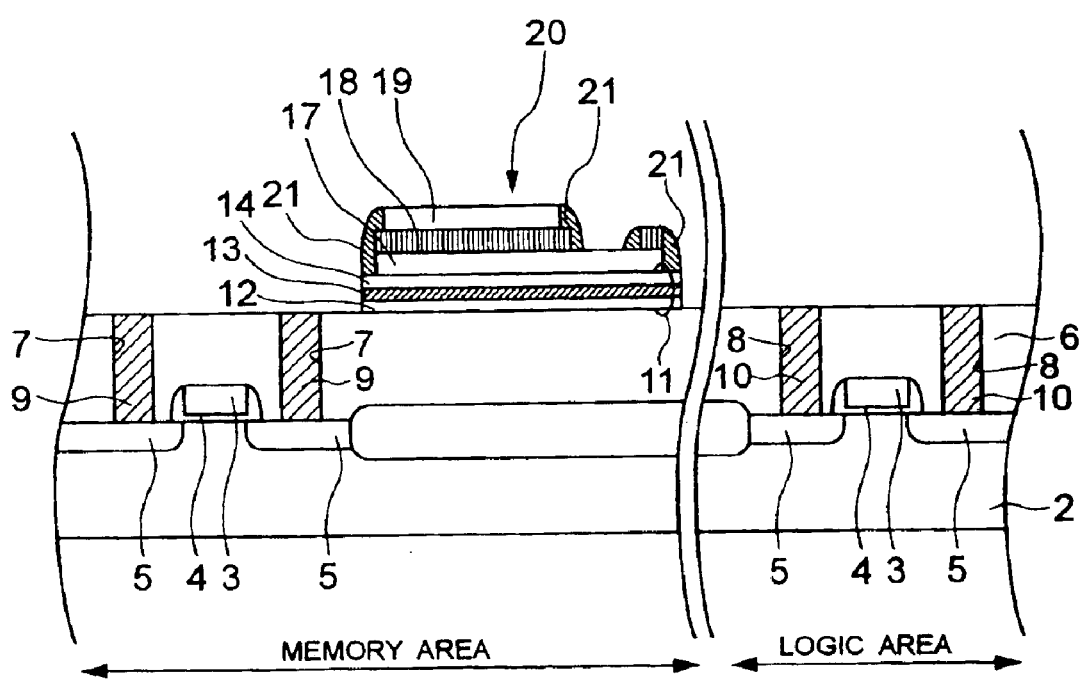
FIG. 7 is a partially enlarged sectional view in a modified embodiment of a manufacturing process of a semiconductor device according to the invention.

A fabrication method of the semiconductor device shown in FIG. 2 is the same as the above fabrication method of the semiconductor device, except for removing the plug antioxidizing film from other than the area on which the capacitor is mounted during the step for forming the side wall film. In other words, the protective film 31 is etched by using an anisotropic etching method as shown in FIG. 7 after forming the protective film 31 on the substrate as shown in FIG. 5A. In such a manner, the side wall film 21 is formed by removing the plug antioxidizing film from areas other than the area on which the capacitor is mounted.

After forming the side wall film 21, a wiring in the memory area including the connection wiring 22 connecting the upper electrode layer 19 of the capacitor to the first contact plug 9, and a logic circuit wiring 25 connected to the second contact plug 10 are formed. After forming these wirings, a second interlayer insulating layer 26 is deposited on the capacitor 20 and the above wiring. In such a manner the semiconductor device 1a, shown in FIG. 2, is obtained.

According to such fabrication method, a step for forming a contact hole in the plug antioxidizing film is not required.

The FeRAM hybrid LSI including a ferroelectric memory has been explained as embodiments of the semiconductor device according to the present invention, but the invention is not so limited. For example, the invention may be also adopted to a ferroelectric memory without a logic area.

According to the semiconductor device and method of manufacturing thereof in the present invention, a contact hole is not required to be formed in a side wall film covering a peripheral edge section of the capcitor to connect a capacitor to an integrated circuit. Accordingly, a disconnection in a connection wiring is prevented, even if the width of the connection wiring is small.

What is claimed is:

1. A semiconductor device comprising:
a substrate including an integrated circuit;
an interlayer insulating layer formed on said substrate, said interlayer insulating layer having a contact hole;
a ferroelectric capacitor formed by a first electrode layer, a ferroelectric layer and a second electrode layer deposited on said interlayer insulating layer in this order;
a wiring layer electrically connecting said second electrode layer of said ferroelectric capacitor to said integrated circuit through said contact hole in said interlayer insulating layer; and
an insulating side wall film covering a peripheral section of said ferroelectric capacitor and electrically insulating said peripheral section of said ferroelectric capacitor from said wiring layer, and being spaced from a peripheral edge section of said contact hole.

2. The semiconductor device according to the claim 1, wherein said insulating side wall film includes a hydrogen diffusion preventing layer.

3. The semiconductor device according to the claim 1, wherein said ferroelectric layer comprises bismuth strontium tantalate.

4. The semiconductor device according to claim 1, wherein at least a portion of said wiring layer is deposited on said insulating side wall film.

5. The semiconductor device according to claim 1, wherein an upper surface of said second electrode layer is free of said insulating side wall film.

6. The semiconductor device according to claim 1, wherein said wiring layer includes a contact plug within said contact hole.

7. The semiconductor device according to the claim 6, wherein said interlayer insulating layer includes a plug oxidation protective film comprising silicon nitride—and silicon oxide—, and said ferroelectric capacitor is mounted on said interlayer insulating layer.

* * * * *